(12) United States Patent
Ng et al.

(10) Patent No.: US 8,146,793 B2
(45) Date of Patent: Apr. 3, 2012

(54) PINS FOR TRANSFERRING MATERIAL

(75) Inventors: Boon Chew Ng, Singapore (SG); Thian Seng Loo, Singapore (SG); Ee Teoh Lim, Singapore (SG)

(73) Assignee: Aurigin Technology Pte. Ltd., Singapore (SG)

( * ) Notice: Subject to any disclaimer, the term of this patent is extended or adjusted under 35 U.S.C. 154(b) by 288 days.

(21) Appl. No.: 11/817,961

(22) PCT Filed: Apr. 19, 2005

(86) PCT No.: PCT/SG2005/000127
§ 371 (c)(1),
(2), (4) Date: Oct. 24, 2008

(87) PCT Pub. No.: WO2006/112791
PCT Pub. Date: Oct. 26, 2006

(65) Prior Publication Data
US 2009/0035531 A1 Feb. 5, 2009
US 2010/0209674 A2 Aug. 19, 2010

(51) Int. Cl.
*B23K 1/20* (2006.01)

(52) U.S. Cl. .......................... 228/52; 228/207; 228/223

(58) Field of Classification Search .................. 228/214, 228/52, 207, 223
See application file for complete search history.

(56) References Cited

U.S. PATENT DOCUMENTS

| 3,377,907 | A | * | 4/1968 | Hurd ................................ 411/70 |
| 4,269,870 | A | | 5/1981 | Boynton |
| 4,342,607 | A | | 8/1982 | Zado |
| 4,360,392 | A | | 11/1982 | Roberts |
| 4,419,146 | A | | 12/1983 | Roberts |
| 5,676,305 | A | | 10/1997 | Potter et al. |
| 5,816,481 | A | | 10/1998 | Economy et al. |
| 6,171,038 | B1 | * | 1/2001 | Pratt et al. ........................ 411/43 |
| 6,296,169 | B1 | | 10/2001 | Ong |

FOREIGN PATENT DOCUMENTS
| JP | 09082719 A | 3/1997 |
| JP | 2003179090 A | 6/2003 |

* cited by examiner

*Primary Examiner* — Jessica L Ward
*Assistant Examiner* — Nicholas D'Aniello
(74) *Attorney, Agent, or Firm* — Seed IP Law Group PLLC

(57) ABSTRACT

A pin for allowing material having adhesive properties to adhere thereon, the pin comprising: a shaft having a longitudinal axis, a distal end and a proximal end opposite to the distal end; and a first tapered portion disposed on the longitudinal axis of the shaft, the tapered portion tapering from a first circumference to a second smaller circumference in a direction toward the proximal end of the shaft.

16 Claims, 4 Drawing Sheets

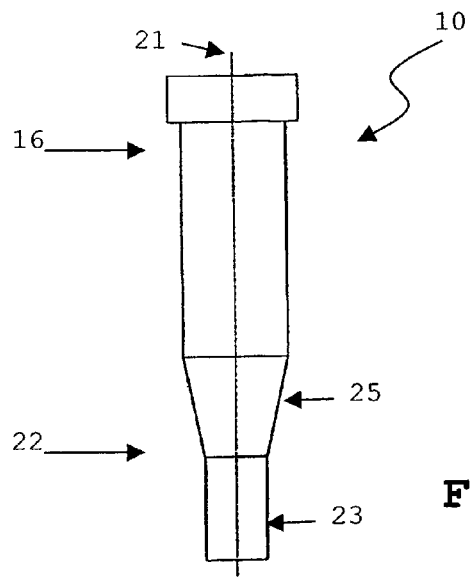
FIG. 1
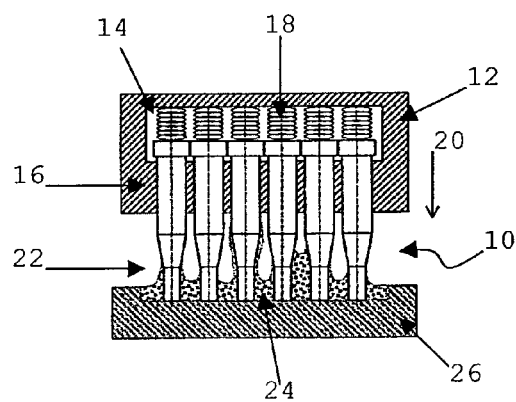
FIG. 1A (Step 1)
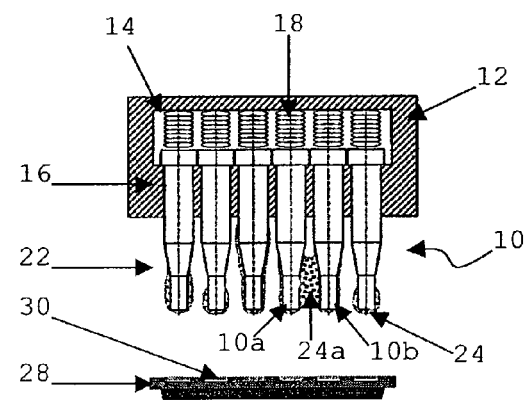
FIG. 1B (Step 2)
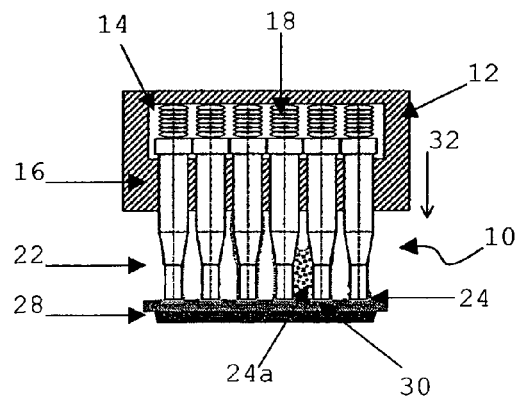
FIG. 1C (Step 3)
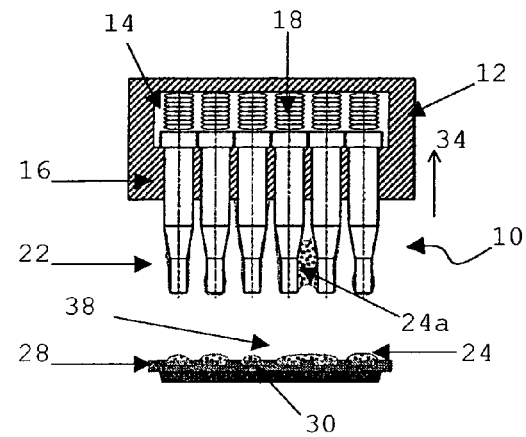
FIG. 1D (Step 4)

PINS FOR TRANSFERRING MATERIAL

TECHNICAL FIELD

The present invention generally relates to pins for transferring material.

BACKGROUND

In the manufacture of semiconductor devices, it is often necessary to connect multiple components of the semiconductor device together with an electrically conductive connector so that an electrical connection can be formed therebetween in use.

The conductive connector may be formed using ball grid array (BGA) technology, which involves depositing solder balls onto a substrate of an electronic component. The solder balls are subjected to soldering to thereby form conductive connectors to conduct electricity.

Prior to the deposition of solder balls onto the substrate, it is necessary to also deposit a flux material on the substrate so that the solder balls can adequately adhere to the substrate.

Current BGA technology uses a pin block to dispense solder flux onto the substrate. A known pin block and method of use is disclosed in U.S. Pat. No. 5,816,481. A disadvantage with the method disclosed in U.S. Pat. No. 5,816,481 is that an insufficient quantity of flux material is often deposited by the pins at the soldering site of the substrate. An insufficient quantity of flux material leads to inadequate soldering. This may cause the semiconductor device to fail in use.

The pins disclosed in U.S. Pat. No. 5,816,481 also have the disadvantage of depositing an excess of flux material onto the substrate. An excess of flux results in flux residue accumulating on the substrate after soldering. Excess flux residue may result in post-soldering cleaning problems.

Another problem associated with excess flux is that solder balls may merge with neighbouring solder balls. This results in an uneven ball size distribution on the substrate causing coplanarity problems at the conductive solder ball connectors, which may result in failure of the semiconductor device.

Accordingly, it is important for a precise amount of flux material to be deposited on the substrate at soldering sites.

Referring to FIGS. 1A to 1D, there is shown a schematic diagram of a known flux imprinting process. In the known flux imprinting process, the flux material is imprinted on the substrate using a flux imprinting device. This device comprises an array of flux pins 10 which are mounted within a chamber 12. An enlarged view of one of the flux pins 10 in FIGS. 1A to 1D is shown in FIG. 1. Referring to step 1 of FIG. 1A, the array of flux pins 10 are mounted within a moveable chamber 12 comprising a housing 14, in which reside proximal ends 16 of the pins 10. Each of the pins 10 is biased by springs 18 in a direction shown by arrow 20 toward the distal ends 22 of the pins 10. The distal ends 22 of the pins 10 are immersed in the flux material 24 in tray 26 to coat the distal ends 22 with the flux material 24.

In step 2 of FIG. 1B, the pins 10 are removed from the flux material 24 and the distal ends 22 of the pins 10 are coated with the flux material 24.

In step 3 of FIG. 1C, the pins 10 are lowered onto a substrate 28 in a direction shown by arrow 32 to deposit the flux material 24 thereon. The substrate 28 includes a plurality of recesses 30 on which the flux material 24 is to be deposited.

In step 4 of FIG. 1D, the pins 10 are released from the substrate 28 in a direction shown by arrow 34.

Referring now in particular to FIG. 1B, it can be seen that a flux bridge 24a is formed between the pins 10a and 10b due to flux creep over prolonged use of the flux imprinting device.

The contributing factors for flux creeping or crawling on the pin 10 is due to the surface energy of the cylindrical surface 23 being constant along the longitudinal axis 21. This constant surface energy causes flux to spread out along the cylindrical surface 23 to achieve equilibrium. The surface energy of the taper surface 25 increases with its circumference along the longitudinal axis 21 and encourages flux to move towards the larger circumference.

The accumulation of flux on the pins, after successive dipping in flux material, results in the flux material 24 tending to creep up the shafts of the pins 10 in a direction toward the proximal ends of the pins 10. This is known as "flux creep" or "flux crawl".

The formation of flux bridges 24a results in an uneven deposition of the flux material 24a on the substrate 28 as shown by arrow 38 in FIG. 1D.

A further problem with flux creep is that it causes a reduced amount of flux that is adhered on the distal end 22 because the bulk of the flux is 'pulled' up the pin shaft. The reduced amount of flux deposited on the distal end 22 results in a reduced amount of flux being deposited on the substrate. This causes an unequal amount of flux deposition on the substrate which may result in defective soldering. This phenomena is particularly pronounced when a flux having a low viscosity is used.

Accordingly, it would be an advantage if embodiments of the invention provided pins which could overcome or at least ameliorate one or more of the disadvantages described above.

SUMMARY

According to a first aspect of the invention, there is provided a pin for allowing material having adhesive properties to adhere thereon, the pin comprising:

a shaft having a longitudinal axis, a distal end and a proximal end opposite to the distal end; and a first tapered portion disposed on the longitudinal axis of the shaft, the tapered portion tapering from a first circumference to a second smaller circumference in a direction toward the proximal end of the shaft.

In one embodiment of the first aspect, the pin comprises a second tapered portion disposed on the longitudinal axis of the shaft between said first tapered portion and said proximal end, the second tapered portion tapering from a third circumference to a fourth smaller circumference in a direction toward the distal end of the shaft.

Advantageously, in use, the taper angle of the first tapered portion relative to the taper angle of the second tapered portion at least partially inhibits adhesion of the material on the second tapered portion. Advantageously, material creep or crawl is substantially prevented from occurring on the shaft of the pin beyond the first tapered portion.

According to a second aspect of the invention, there is provided a flux imprint apparatus for imprinting flux on a substrate, the flux imprint apparatus comprising:

a support; and an array of pins mounted to the support, wherein each of said pins comprises: a shaft having a longitudinal axis, a distal end and a proximal end opposite to the distal end; and a first tapered portion disposed on the longitudinal axis of the shaft, the tapered portion tapering from a first circumference to a second smaller circumference in a direction toward the proximal end of the shaft.

In one embodiment of the second aspect, each of the pins comprises a second tapered portion disposed on the longitudinal axis of the shaft between said first tapered portion and said proximal end, the second tapered portion tapering from a third circumference to a fourth smaller circumference in a direction toward the distal end of the shaft.

According to a third aspect of the invention, there is provided a method of imprinting flux using a flux imprint apparatus comprising:

a support; and an array of pins mounted to the support, wherein each of said pins comprises: a shaft having a longitudinal axis, a distal end and a proximal end opposite to the distal end; and a first tapered portion disposed on the longitudinal axis of the shaft, the tapered portion tapering from a first circumference to a second smaller circumference in a direction toward the proximal end of the shaft; the method comprising the steps of:

(a) contacting the array of pins with flux material;

(b) removing the array of pins from the flux material while at least some of the flux material adheres to at least the first tapered portion of the pins; and (c) depositing flux material on a substrate by contacting the distal ends of the pins on the substrate.

In said method of said third aspect, said at least some flux material adheres to the distal ends of the pins while the first tapered portions at least partially inhibit creeping of flux towards the proximal end.

In one embodiment of the third aspect, each of the pins comprises a second tapered portion disposed on the longitudinal axis of the shaft between said first tapered portion and said proximal end, the second tapered portion tapering from a third circumference to a fourth smaller circumference in a direction toward the distal end of the shaft.

DEFINITIONS

The following words and terms used herein shall have the meaning indicated:

The term 'taper angle' as used herein refers to the angle of tapering between a first circumference to a second smaller circumference of a tapered portion relative to the longitudinal axis of a shaft on which the tapered portion is disposed.

The terms "flux", "flux material" and variations thereof, refer to any substance that aids, induces, or otherwise actively participates in fusing, flowing, and/or preventing the oxidation of a solder ball to a substrate during a soldering process. The flux may also de-oxidise and/or clean the pads on the substrate during soldering. Exemplary flux material is disclosed in U.S. Pat. No. 4,419,146, U.S. Pat. No. 4,360,392, U.S. Pat. No. 4,342,607, and U.S. Pat. No. 4,269,870.

Unless specified otherwise, the terms "comprising" and "comprise", and grammatical variants thereof, are intended to represent "open" or "inclusive" language such that they include recited elements but also permit inclusion of additional, unrecited elements.

As used herein, the term "about", in the context of concentrations of components of the formulations, typically means +/−5% of the stated value, more typically +/−4% of the stated value, more typically +/−3% of the stated value, more typically, +/−2% of the stated value, even more typically +/−1% of the stated value, and even more typically +/−0.5% of the stated value.

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

DETAILED DISCLOSURE OF EMBODIMENTS

Exemplary, non-limiting embodiments of a pin for allowing material having adhesive properties to adhere thereon will now be disclosed.

The pin comprises a shaft having a longitudinal axis, a distal end and a proximal end. The pin also comprises a first tapered portion disposed on a longitudinal axis of the shaft. The first tapered portion tapers from a first circumference to a second smaller circumference in a direction toward the proximal end of the shaft. The pin may also comprise a second tapered portion disposed on the longitudinal axis of the shaft between said first tapered portion and said proximal end. The second tapered portion tapers from a third circumference to a smaller fourth circumference in a direction toward the distal end of the shaft.

Advantageously, in use, the taper angle of the first tapered portion relative to the taper angle of the second tapered portion at least partially inhibits flux creeping past the second tapered portion. Advantageously, material creep or crawl is substantially prevented from occurring on the shaft of the pin beyond the first tapered portion.

In one embodiment, the pin comprises a third tapered portion disposed on the longitudinal axis of the shaft between said first tapered portion and said distal end. The third tapered portion tapers from a fifth circumference to a sixth smaller circumference. In one embodiment, the third tapered portion tapers in a direction toward the proximal end of the shaft.

There may be a non-tapered section between the third tapered portion and the first tapered portion.

There may be a non-tapered section between the first tapered portion and the second tapered portion.

In one embodiment, the pin comprises a fourth tapered portion disposed on the longitudinal axis of the shaft between said third tapered portion and said first tapered portion. The fourth tapered portion tapers from a seventh circumference to an eighth smaller circumference. In one embodiment, the fourth tapered portion tapers in a direction toward the distal end of the shaft.

The sixth circumference of the third tapered portion and the eighth circumference of the fourth tapered portion may be the same.

In one embodiment, the fifth circumference of the third tapered portion is less than at least one of the first circumference of the first tapered portion and the third circumference of the second tapered portion. In one embodiment, the second circumference of the first tapered portion is the same as the fourth circumference of the second tapered portion.

In one embodiment, the sixth circumference of the third tapered portion is less than at least one of the second circumference of the first tapered portion and the fourth circumference of the second tapered portion.

The taper angles of the first and second tapered portions may be the same or different. In one embodiment, the taper angle of the second tapered portion is less than the taper angle of the first tapered portion.

In one embodiment, the taper angle of the second tapered portion is in the range selected from the group consisting of about 0.5° to about 40°; about 0.5° to about 35°; about 0.5° to about 30°; about 0.5° to about 25°; about 0.5° to about 20°; about 0.5° to about 15°; about 0.5° to about 10°; about 0.5° to about 5°; about 0.75° to about 40°; about 1° to about 40°; about 1.5° to about 40°; about 2° to about 40°; and about 2° to about 5°.

In one embodiment, the taper angle of the first tapered portion is in the range selected from the group consisting of about 0.5° to about 60°; about 0.5° to about 50°; about 0.5° to about 40°; about 0.5° to about 35°; about 0.5° to about 30°; about 0.5° to about 25°; about 0.5° to about 20°; about 0.5° to about 15°; about 0.5° to about 10°; about 0.5° to about 5°; about 0.75° to about 60°; about 1° to about 60°; about 1.5° to about 60°; about 2° to about 60°; and about 2° to about 5°.

In one embodiment, the distal end of the pin may comprise an end portion for providing a wear face at the end face of the distal end. The end portion may be non-tapered. Advantageously, the end portion may increase the life of the pin by providing a contact surface that is subjected to wearing in use.

The tapered portions may form an integral structure with the shaft. In other embodiments, the tapered portions may not be integral formed with the shaft but may be attached to the shaft.

In one embodiment, the shaft is circular shape when viewed in cross-section transverse to the longitudinal axis. In other embodiments, the shaft may be any shape, such as oval, square or hexagonal etc, when viewed in a cross-sectional view transverse to the longitudinal axis.

A proximal end of the shaft, opposite to the distal end, may be mounted to a support. A biasing means may be provided between the support and the proximal end to bias the pin along the longitudinal axis in a direction toward the distal end.

The support may comprise a housing having a chamber. The pins may partially extend into the chamber through a series of pin holes provided in the housing. In one embodiment, the proximal ends of the pins comprise a flange. The biasing means may be disposed between the flanges of the pins and a wall of the chamber. The flange may be used to abut the pin holes provided in the housing to prevent the pins from moving when under the bias force.

In one embodiment, the biasing means is at least one spring. In another embodiment, a spring may abut each of the pin flanges.

In other embodiments, the biasing means comprises a plate and one or more springs that bias the plate toward the flanges of the pins. Other embodiments may comprise a rubber membrane backed by a larger spring or sponge, or a rubber membrane biased by pressurised air.

In one embodiment, there is provided a flux imprint apparatus for imprinting flux material on a substrate. The flux imprint apparatus comprises a support and an array of the pins mounted to the support.

In one embodiment, there is also provided a method of imprinting flux on a substrate using the flux imprint apparatus. The method of imprinting flux material comprising the steps of:

(a) contacting the array of pins with flux material; and (b) removing the array of pins from the flux material while at least some flux material adheres to at least the first tapered portion of the pins; and (c) depositing flux material on a substrate by contacting the distal ends of the pins on the substrate.

Advantageously, while the tapered portions at least partially inhibit flux creep up the shaft, beyond the first tapered portion.

The contacting step may comprise the step of inserting the array of pins into flux material.

The depositing may comprise pressing the pins, having said flux adhered to said distal ends of said pins, onto the substrate. The method may comprise removing the pins from the substrate.

BRIEF DESCRIPTION OF DRAWINGS

The accompanying drawings illustrate a disclosed embodiment and serve to explain the principles of the disclosed embodiment. It is to be understood, however, that the drawings are designed for purposes of illustration only, and not as a definition of the limits of the invention.

FIG. 1 is a schematic diagram of a prior art pin being used in a flux imprinting device;

FIGS. 1A to 1D respectively show schematic diagrams of Steps 1 to 4 of a prior art method for imprinting flux material on a substrate: FIG. 1A shows an array of prior art pins of a flux imprinting device being immersed in flux material; FIG. 1B shows the prior art pins loaded with the flux material and positioned above a substrate to be imprinted; FIG. 1C shows the prior art pins imprinting flux material on the substrate; and FIG. 1D shows the prior art pins being removed from the substrate after flux imprinting.

FIG. 4A shows the array of pins in accordance with an embodiment of the invention being immersed in flux material; FIG. 4B shows the pins in accordance with an embodiment of the invention being loaded with flux material and positioned above a substrate to be imprinted; FIG. 4C shows the pins in accordance with an embodiment of the invention imprinting flux material on the substrate; and FIG. 4D shows the pins in accordance with an embodiment of the invention being removed from the substrate after flux imprinting.

BEST MODE

Non-limiting examples of the invention, including the best mode, and a comparative example will be further described in greater detail by reference to specific examples, which should not be construed as in any way limiting the scope of the invention.

Figure 2A:
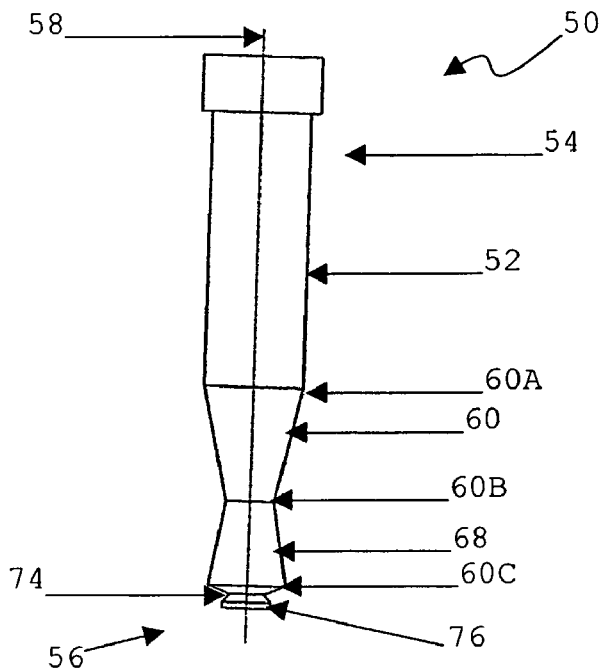
FIG. 2A shows a side view of a pin in accordance with an embodiment of the invention.

Referring to FIG. 2A there is shown a pin in accordance with one exemplary embodiment of the invention. The pin 50 comprises a longitudinal body in the form of shaft 52 having a proximal end section 54 and a distal end section 56. The shaft 52 is circular when viewed in cross section as shown by the end view of FIG. 2B. A longitudinal axis 58 is shown by line 58 extending through the shaft 52.

The pin 50 comprises a first tapered portion in the form of tapered portion 68 that is disposed between distal end section 56 and proximal end section 54 of the shaft 52. The tapered portion 68 tapers in a direction toward the proximal end section 56 from a first circumference 60C to a second smaller circumference 60B. The pin 50 also comprises a second tapered portion in the form of tapered portion 60 that is disposed between the proximal end section 54 and tapered portion 68. The tapered portion 60 tapers in a direction toward the distal end section 56 from circumference 60A to a smaller circumference 60B.

Figure 2B:
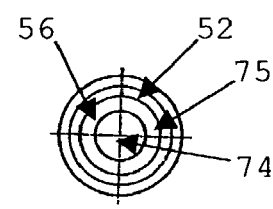
FIG. 2B shows an end view of the pin of FIG. 2A.

The pin 50 also comprises a third tapered portion 74, which can be seen in FIG. 2B. The third tapered portion 74 has a smaller circumference when viewed from an end view than the circumference of the tapered portions 60 and 68. The third tapered portion 74 tapers in a direction toward the tapered portion 68 from circumference 74A to 74B.

Figure 2C:
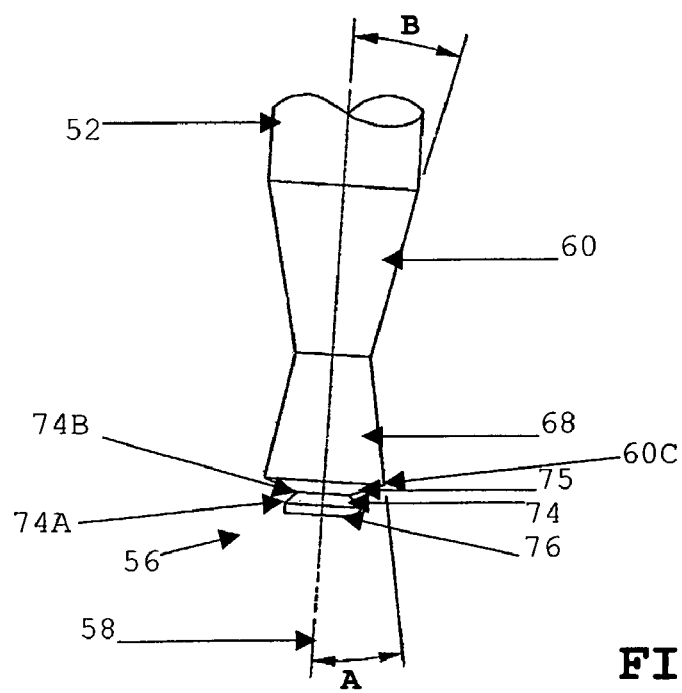
FIG. 2C shows a close-up view of a distal end of the pin of FIG. 2A.

The pin 50 also comprises a fourth tapered portion 75, which can be seen in FIG. 2C. The fourth tapered portion 75 tapers in a direction toward the third tapered portion 74 from circumference 68B to 74B.

The third tapered portion 74 also includes a wear portion in the form of an end portion 76. The end portion 76 is provided at the end face of the distal end section 56 to provide extra material for wear and tear of the pin when in use. Accordingly, the end portion 76 increases the working live of the pin.

The pin 50 is made by turning out on a lathe to form the shape shown in FIG. 2A. The metal in this embodiment is stainless steel. It should be noted that in other embodiments, the pins may be made by placing molten metal in a mould to form the shape show in FIG. 2A.

Referring now to FIG. 2C there is shown an enlarged view of the distal end section 56 and the region approximate to the distal end section 56. The enlarged view of FIG. 2C clearly shows the tapered angles in this particular embodiment of the tapered portions 60 and 68.

As can be seen in FIG. 2C, the tapered angle A of the tapered portion 68 is larger than the tapered angle B of the tapered portion 60. In this particular embodiment, the tapered angle A is 4° while the tapered angle B is 3.5°. The dimensions (which are exemplary) are as follows: diameter of the shaft 52 is 0.4 mm; diameter of the circumference 60B is 0.16; diameter of the circumference 60C is 0.23 mm; and diameter of the circumference 74A is 0.16 mm.

The flux material has an inherent stickiness or tackiness which results in the flux adhering to the tapered portion 68. The shape of the flux on the pins is determined by its surface tensile forces as well as the geometrical features of the pins.

Without being bound by theory, it is thought that flux material, being liquid or quasi-liquid, will establish a stable state shape by moving to or spreading over a solid region with sufficient surface energy to stabilise itself with its own surface tensile energy.

Flux will spread out along the conical surface of tapered portion 68 to achieve equilibrium. The surface energy of the tapered surface 68 increases with its circumference. As such, it will tend to retain the flux towards the larger circumference and thereby limit or inhibit flux creep toward the proximal ends 54.

The tapered portions (68,60) in FIG. 2C provide a changing surface energy along the longitudinal axis 58 with larger circumferences having larger surface energy. The relative angle of the tapered portion 60 to the tapered portion 68 produces a different rate of change in surface energy on the tapered surfaces 60 and 68 along its longitudinal axis 58. Because the taper angles are in opposite directions, an opposing rate of change in surface energy is formed along the longitudinal axis 58. The higher surface energy on tapered surface 68 as opposed to the weaker surface energy on tapered surface 60 limits the tendency for the flux to creep beyond the tapered portion 68 towards tapered surface 60. Accordingly, the profile created by the combination of the second tapered portion 60 and the first tapered portion 68, achieves an advantageous effect in that the flux material 88 that is deposited thereon, and any residual flux material 88 on the distal ends 56 of the pins 50, does not tend to creep beyond the first tapered portion 68 towards the proximal ends 54 of the pins 50.

Figure 3:
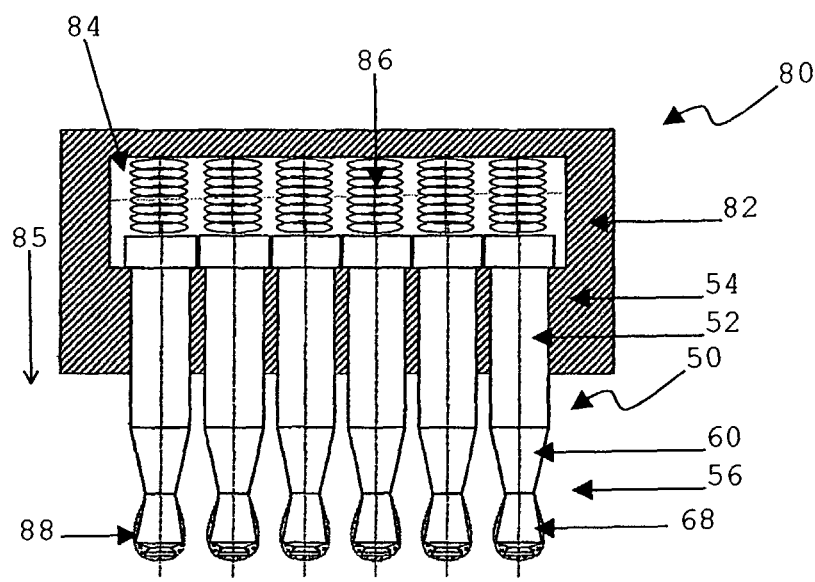
FIG. 3 shows a flux imprint device having an array of the pins disclosed in FIG. 2A.

Referring now to FIG. 3, there is shown a flux imprint device 80. The flux imprint device 80 comprises a support in the form of pin housing 82 for mounting and supporting an array of pins 50. The proximal ends 54 of the pins 10 are mounted within a chamber 84 of the pin housing 82. The pin housing 82 comprises a plurality of pin conduits for allowing the pins 50 to be located therein. The pins 50 are each biased by a set of springs 86 in the direction of arrow 85. The springs 86 allow the pins 50 to be subjected to a compressive force during loading of the flux and during imprinting. The springs 86 also enable the array of pins 50 to conform to the contours of the surfaces on which the flux material 88 is to be imprinted.

Figure 3A:
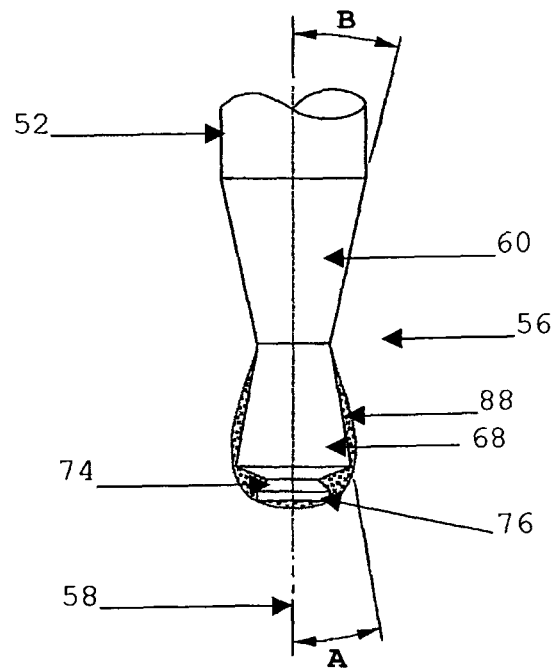
FIG. 3A is a close-up of one of the pins of FIG. 3 loaded with flux material.

FIG. 3A illustrates a flux material 88 loaded distal end 56 of the pin 50. The contour shape of the distal end section 56 provided by the tapered portion 68 enables a "tear-drop" shape droplet to be formed thereon. The attainment of such a shape facilitates transfer of the droplet of flux material 88 from the pin 50 to a substrate, leaves behind minimal residual flux material at the distal end 56. Furthermore, it will be appreciated that flux material does not creep up substantially past the tapered portion 68 due to the opposing force that is imparted by the tapered angle B of the tapered portion 60.

Figures 4A, 4B:
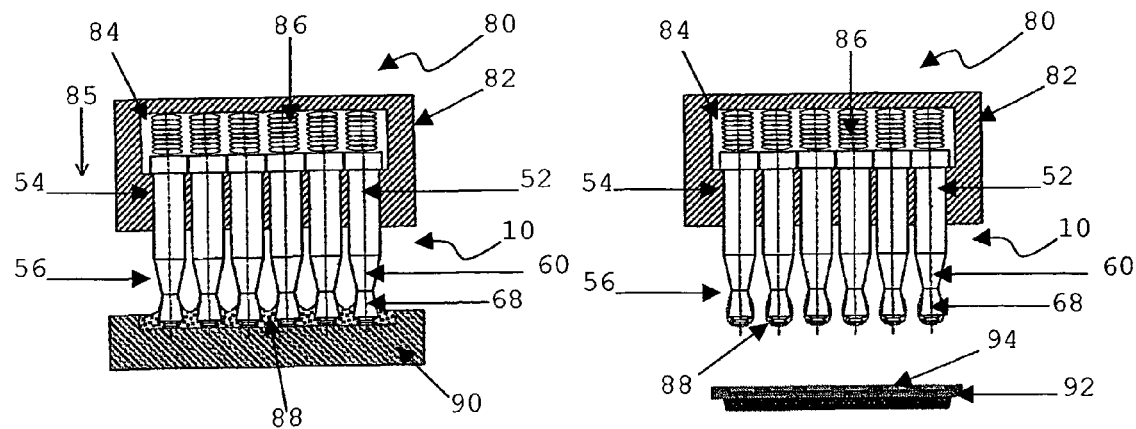
FIGS. 4A to 4D respectively show schematic diagrams of a method for imprinting flux material on a substrate in accordance with an embodiment of the invention.

Referring now to FIG. 4, there is shown a schematic diagram of the various steps for imprinting flux material on a substrate. The process involves lowering of the pins 50 into the flux material 88 provided in a flux tray 90 such that the distal ends 56 are immersed in the flux material 88 as shown in FIG. 4A. The flux material 88, due to its inherent adhesive properties, adheres to the distal ends 56 when the pins are elevated from the flux tray 90. The springs 86 allow the pins to be movable so that any excessive forces imparted to the springs 86 during the loading step are dissipated by the springs 86.

The pins 50, loaded with the flux material 88 on the distal ends 56 are then place over a substrate 92 which has a series of recesses 94 for allowing the deposition of the flux material 88 as shown in FIG. 4B.

Figures 4C, 4D:
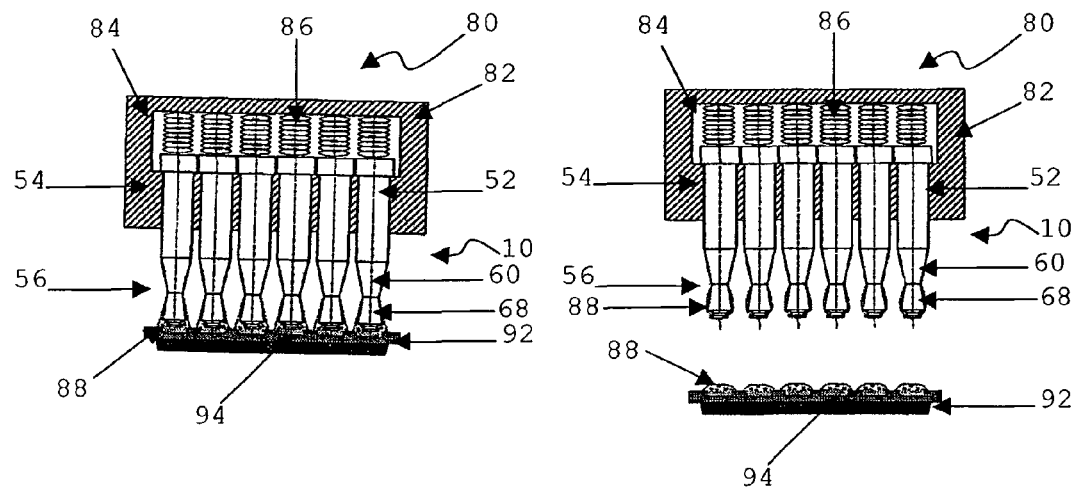

The pins 50 are brought into contact with the recesses 94 of the substrate 92 as shown in FIG. 4C. The array of pins 50 are subsequently elevated from the substrate 92 and the flux material 88 imprinted thereon as shown in FIG. 4D.

Referring in particular to FIG. 4D, after imprinting, the residual flux material 88 resides around the first tapered portions 68 at the distal ends 56 of the pins 50. The flux material 88 does not creep upwards beyond the first tapered portion 68 and toward the second tapered portion 60 and the shaft 52. Accordingly, the pin in accordance with the embodiment, prevents material creep or crawl from occurring on the shaft 52 of the pin 50 beyond the first tapered portion 68.

As described above, the loading of the flux material 88 at the distal end 56 of the pin 50 in the configuration of a "tear-drop" shape droplet minimises the amount of residual flux material 88 residing at the distal end 56 after imprinting. Accordingly, bridging of the flux material 88 between the array of pins 50 does not occur which could otherwise result in an uneven deposition of the flux material 88 on the substrate 92.

APPLICATIONS

It should be appreciated that the pins 50 may be used to transfer not only flux material but other types of material that is capable of adhering to the pin surface. Exemplary materials include chemicals for genomics research using microarray printing.

It will be appreciated that the pins 50 provide a precise amount of flux material to be deposited on the substrate at soldering sites. This avoids the problems associated with prior art pins. In particular, the pins 50 inhibit or prevent the accumulation of flux on the pins, beyond the tapered portion 68 after successive dipping in flux material. Accordingly, pins 50 avoid or prevent creep up the shafts 52 in a direction toward the proximal end section 54.

By avoiding flux creep, the pins 50 avoid the formation of flux bridges forming there between and thereby avoid uneven formation of small flux at the distal ends. The 'tear-drop' shape and size of the flux formed on the pins reduced and/or inhibits flux creep so that flux deposition is much more consistent across pins 50. The pins 50 therefore provide an even deposition of the flux material on the substrate 92.

It will be apparent that various other modifications and adaptations of the invention will be apparent to the person skilled in the art after reading the foregoing disclosure without departing from the spirit and scope of the invention and it is intended that all such modifications and adaptations come within the scope of the appended claims.

The invention claimed is:

1. A flux imprint apparatus for imprinting flux on a substrate, the flux imprint apparatus comprising: a support; and an array of pins mounted to the support, wherein each of said pins comprises: a shaft having a longitudinal axis, a distal end and a proximal end opposite to the distal end; a first tapered portion disposed on the longitudinal axis of the shaft, the tapered portion tapering from a first circumference to a second smaller circumference in a direction toward the proximal end of the shaft; and a second tapered portion disposed on the longitudinal axis of the shaft between said first tapered portion and the proximal end, the second tapered portion tapering from a third circumference to a fourth smaller circumference that meets and integrally forms with the second circumference of the first tapered portion; wherein the taper angle of the first tapered portion is in the range of 3 degrees to 6 degrees relative to the longitudinal axis and the taper angle of the second tapered portion is in the ramie of 2 degrees to 5 degrees relative to the longitudinal axis; wherein the taper angles of the first and second tapered portions are different; and wherein there is no non-tapered section between the first tapered portion and the second tapered portion.

2. The flux imprint apparatus according to claim 1, wherein in use, the taper angle of the first tapered portion at least partially inhibits flux creep on the shaft in the direction of the proximal end.

3. The flux imprint apparatus according to claim 1, wherein in use, the taper angle of the first tapered portion relative to the taper angle of the second tapered portion at least partially inhibits adhesion of the flux beyond the first tapered portion.

4. The flux imprint apparatus according to claim 1, further comprising biasing means disposed between the support and the proximal ends of said array of pin shafts.

5. The flux imprint apparatus according to claim 4, wherein the biasing means is at least one spring.

6. The flux imprint apparatus according to claim 1, wherein each of the pins further comprise a third tapered portion disposed on the longitudinal axis of the shaft between said first tapered portion and said distal end.

7. The flux imprint apparatus according to claim 6, wherein the third tapered portion tapers from a fifth circumference to a sixth smaller circumference in a direction toward the proximal end.

8. The flux imprint apparatus according to claim 7, wherein the fifth circumference of the third tapered portion is less than the first circumference of the first tapered portion.

9. The flux imprint apparatus according to claim 1, wherein the second circumference of the first tapered portion is the same as the fourth circumference of the second tapered portion.

10. The flux imprint apparatus according to claim 1, wherein the taper angle of the second tapered portion is less than the taper angle of the first tapered portion.

11. The flux imprint apparatus according to claim 1, wherein the distal ends of the pins each comprise a wear portion at the end face of the distal end.

12. The flux imprint apparatus according to claim 6, wherein the first tapered portion, the second tapered portion and the third tapered portion form an integral structure with the shaft.

13. A method of imprinting flux using a flux imprint apparatus comprising a support; and an array of pins mounted to the support, wherein each of said pins comprises: a shaft having a longitudinal axis, a distal end and a proximal end opposite to the distal end; a first tapered portion disposed on the longitudinal axis of the shaft, the tapered portion tapering from a first circumference to a second smaller circumference in a direction toward the proximal end of the shaft; and a second tapered portion disposed on the longitudinal axis of the shaft between said first tapered portion and the proximal end, the second tapered portion tapering from a third circumference to a fourth smaller circumference that meets and integrally forms with the second circumference of the first tapered portion; wherein the taper angle of the first tapered portion is in the range of 3 degrees to 6 degrees relative to the longitudinal axis and the taper angle of the second tapered portion is in the range of 2 degrees to 5 degrees relative to the longitudinal axis; wherein the taper angles of the first and second tapered portions are different and wherein there is no non-tapered section between the first tapered portion and the second tapered portion; the method comprising the steps of: (a) contacting the array of pins with flux material; (b) removing the array of pins from the flux material while at least some of the flux material adheres to at least the first tapered portion of the pins; and (c) depositing flux material on a substrate by contacting the distal ends of the pins on the substrate.

14. The method according to claim 13, wherein the step of contacting the array of pins with flux material comprises inserting the array of pins into the flux material.

15. The method according to claim 13, wherein the step of depositing comprises pressing the pins onto the substrate.

16. The method according to claim 13, wherein the method further comprises the step of removing the pins from the substrate.

* * * * *

UNITED STATES PATENT AND TRADEMARK OFFICE
CERTIFICATE OF CORRECTION

| | | |
|---|---|---|
| PATENT NO. | : 8,146,793 B2 | Page 1 of 1 |
| APPLICATION NO. | : 11/817961 | |
| DATED | : April 3, 2012 | |
| INVENTOR(S) | : Boon Chew Ng et al. | |

It is certified that error appears in the above-identified patent and that said Letters Patent is hereby corrected as shown below:

Column 9, Line 43:
"second tapered portion is in the ramie of 2 degrees to 5" should read, --second tapered portion is in the range of 2 degrees to 5--.

Signed and Sealed this
Twenty-fourth Day of July, 2012

David J. Kappos
*Director of the United States Patent and Trademark Office*